United States Patent
Bae

(10) Patent No.: US 9,356,172 B2
(45) Date of Patent: May 31, 2016

(54) SOLAR CELL AND METHOD FOR MANUFACTURING SAME

(71) Applicant: LG INNOTEK CO., LTD., Seoul (KR)

(72) Inventor: Do Won Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/527,217

(22) Filed: Oct. 29, 2014

(65) Prior Publication Data

US 2015/0047696 A1    Feb. 19, 2015

Related U.S. Application Data

(63) Continuation of application No. 13/823,803, filed as application No. PCT/KR2011/006850 on Sep. 16, 2011.

(30) Foreign Application Priority Data

Sep. 16, 2010  (KR) .......................... 10-2010-0091277

(51) Int. Cl.
*H01L 31/0216*    (2014.01)
*H01L 31/0392*    (2006.01)

(52) U.S. Cl.
CPC ............................. *H01L 31/03928* (2013.01)

(58) Field of Classification Search
CPC ..................... H01L 31/18; H01L 31/02167
See application file for complete search history.

(56) References Cited

U.S. PATENT DOCUMENTS

| 5,693,207 A | * | 12/1997 | Fromson | .............. B01J 37/0226 205/112 |
| 6,222,118 B1 | * | 4/2001 | Matsushita | ....... H01L 31/02164 136/252 |
| 6,468,923 B1 | | 10/2002 | Yonehara et al. | |
| 2002/0108649 A1 | | 8/2002 | Fujimori et al. | |
| 2002/0153595 A1 | | 10/2002 | Tayanaka | |
| 2005/0034755 A1 | | 2/2005 | Okada et al. | |
| 2005/0074915 A1 | | 4/2005 | Tuttle et al. | |
| 2005/0098205 A1 | * | 5/2005 | Roscheisen et al. | .......... 136/263 |
| 2005/0121068 A1 | * | 6/2005 | Sager | .................. H01L 51/4213 136/252 |
| 2007/0209700 A1 | | 9/2007 | Yonezawa et al. | |
| 2010/0307579 A1 | * | 12/2010 | Sheng | ............... H01L 31/02168 136/256 |
| 2011/0186123 A1 | * | 8/2011 | Mukai | ............... H01L 31/03928 136/256 |
| 2012/0012182 A1 | * | 1/2012 | Satou | .................. H01L 31/0322 136/262 |
| 2012/0017969 A1 | * | 1/2012 | Yuuya | ................. H01L 31/0392 136/244 |

FOREIGN PATENT DOCUMENTS

| CN | 1221205 A | 6/1999 |
| CN | 1269599 A | 10/2000 |
| CN | 1703782 A | 11/2005 |

(Continued)

OTHER PUBLICATIONS

International Search Report in International Application No. PCT/KR2011/006850, filed Sep. 16, 2011.

(Continued)

*Primary Examiner* — Golam Mowla
(74) *Attorney, Agent, or Firm* — Saliwanchik, Lloyd & Eisenschenk

(57) ABSTRACT

Disclosed is a solar cell including a support substrate, a barrier layer on the support substrate, and a photo-electro conversion part on the barrier layer. The barrier layer comprises first and second barrier layers having porosities different from each other.

10 Claims, 8 Drawing Sheets

(56) References Cited

FOREIGN PATENT DOCUMENTS

| | | | |
|---|---|---|---|
| JP | 61251589 | A | 11/1986 |
| JP | 62089369 | A | 4/1987 |
| JP | 2005317728 | A | 11/2005 |
| JP | 2009267337 | A | 11/2009 |
| KR | 10-2002-0045545 | A | 6/2002 |
| KR | 10-2004-0095320 | A | 11/2004 |
| KR | 10-2009-0076035 | A | 7/2009 |
| KR | 10-2010-0029414 | A | 3/2010 |

OTHER PUBLICATIONS

Notice of Allowance dated Oct. 27, 2011 in Korean Application No. 10-2010-0091277, filed Sep. 16, 2010.

Office Action dated Dec. 22, 2014 in Chinese Patent Application No. 201180039615.X.

Office Action dated May 19, 2015 in Japanese Patent Application No. 2013-529068.

\* cited by examiner

SOLAR CELL AND METHOD FOR MANUFACTURING SAME

CROSS-REFERENCE TO RELATED APPLICATIONS

This application is a continuation of U.S. application Ser. No. 13/823,803, filed Mar. 15, 2013, which is the U.S. national stage application of International Patent Application No. PCT/KR2011/006850, filed Sep. 16, 2011, which claims priority to Korean Application No. 10-2010-0091277, filed Sep. 16, 2010, the disclosures of each of which are incorporated herein by reference in their entirety.

TECHNICAL FIELD

The embodiment relates to a solar cell and a method for manufacturing the same.

BACKGROUND ART

Recently, as the demand for energy is increased, researches and studies on solar cells to convert solar energy into electrical energy have been actively carried out.

The solar cells may be classified into silicon-based solar cells, non-silicon-based solar cells, and dye-sensitized solar cells. Among them, the non-silicon-based solar cells may have the form of a thin film to reduce the loss of material while widening the use range of the solar cells. In addition, a light absorbing layer used in the silicon-based solar cells is less degraded by a light to represent a long life span.

In order to realize flexible solar cells, the technology to employ a support substrate made of metallic material has been applied.

DISCLOSURE OF THE INVENTION

Technical Problem

The embodiment provides a solar cell and a method for manufacturing the same, capable of preventing impurities from diffusing from a photo-electro conversion part to a support substrate, and preventing the de-lamination between the support substrate and the photo-electro conversion part.

Technical Solution

According to the embodiment, there is provided a solar cell including a support substrate, a barrier layer on the support substrate, and a photo-electro conversion part on the barrier layer, wherein the barrier layer includes first and second barrier layers having porosities different from each other.

According to the embodiment, there is provided a method for manufacturing a solar cell. The method includes forming a first barrier layer on a support substrate, forming a second barrier layer, which has a porosity different from a porosity of the first barrier layer, on the first barrier layer, and forming a photo-electro conversion part on the second barrier layer.

Advantageous Effects

As described above, according to the solar cell of the embodiment, the first barrier layer having a denser structure is formed in adjacent to the support substrate, and the second barrier layer having a less dense structure is formed in adjacent to the photo-electro conversion part. Therefore, the first barrier layer can prevent the impurities generated when manufacturing the solar cell from diffusing to the photo-electro conversion part.

In addition, the second barrier layer having a porous structure increases the contact area with the photo-electro conversion part, thereby not only effectively preventing the delamination between the support substrate and the photo-electro conversion part, but improving the photo-electro conversion efficiency.

In addition, in the method for manufacturing the solar cell according to the embodiment, the first and second barrier layers can be formed by changing only a simple process condition using the same material. Therefore, the manufacturing cost of the solar cell according to the embodiment can be reduced.

MODE FOR CARRYING OUT THE INVENTION

Figure 1:
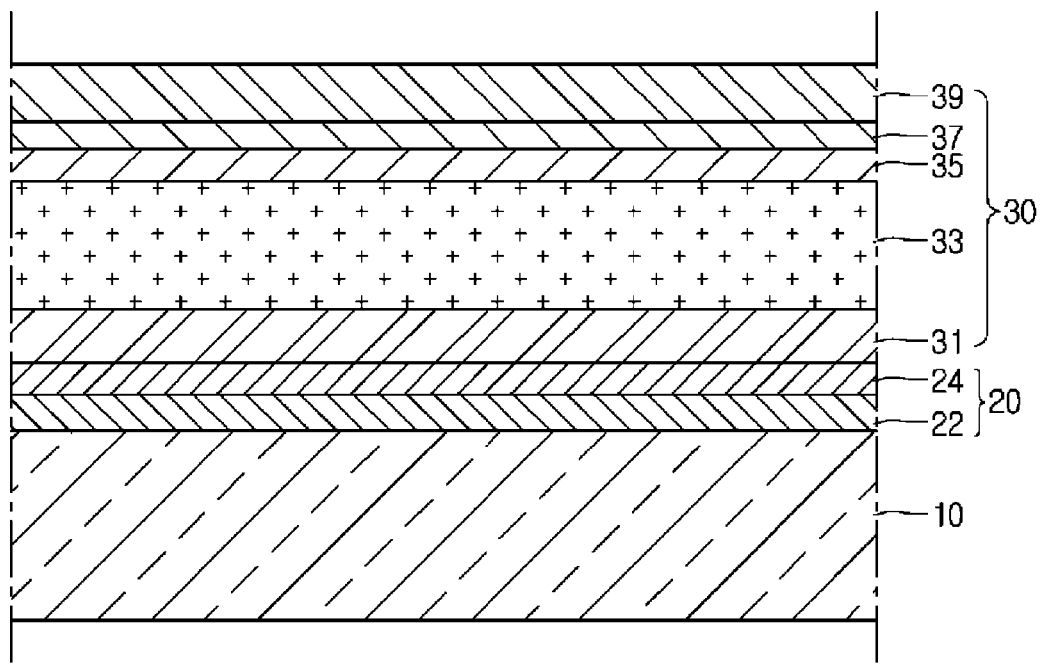
FIGS. 1 and 2 are sectional views schematically showing a solar cell according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Hereinafter, the embodiment will be described in detail with reference to accompanying drawings so that those skilled in the art can easily realize the embodiment.

Figure 2:
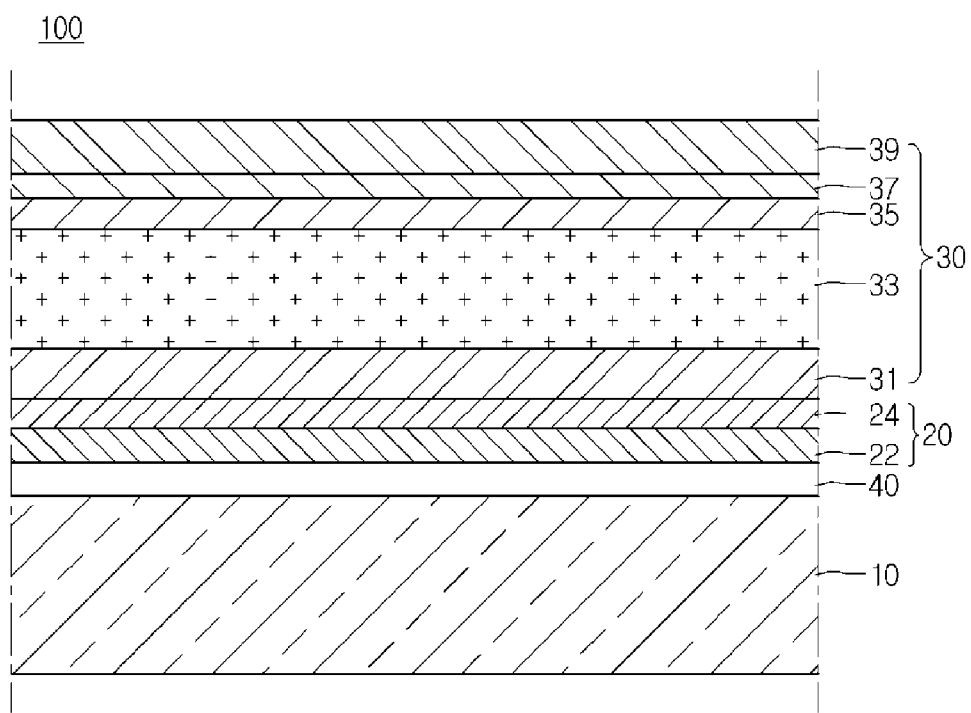

FIGS. 1 and 2 are sectional views schematically showing the solar cell according to the embodiment.

Referring to FIG. 1, a solar cell 100 according to the embodiment includes a support substrate 10, a barrier layer 20 on the support substrate 10, and a photo-electro conversion part 30 on the barrier layer 20. In addition, the solar cell 100 according to the embodiment further includes a metallic layer 40 on the support substrate 10 as shown in FIG. 2.

The support substrate 10 has the shape of a plate, and supports the barrier layer 20 and the photo-electro conversion part 30.

The support substrate 10 may include a rigid substrate or a flexible substrate. In detail, the support substrate 120 may include a flexible substrate. For example, the support substrate 10 may include a flexible metallic substrate. Accordingly, the solar cell 100 can be realized as a flexible solar cell.

The support substrate 10 may include a solar cell substrate generally used in the art which the present invention pertains to. For example, the support substrate 10 may include a material selected from the group consisting of iron, lead (Pb), cobalt (Co), nickel (Ni), copper (Cu), tin (Sn), and the combination thereof, but the embodiment is not limited thereto. According to one embodiment, the support substrate 10 may include stainless steel mainly made of iron.

In addition, the support substrate 10 may include an insulator such as glass or plastic.

The barrier layer 20 is provided on the support substrate 10. In detail, the barrier layer 20 is interposed between the support substrate 10 and the photo-electro conversion part 30. The barrier layer 20 has a thickness of about 5 µm or less, but the embodiment is not limited thereto.

The barrier layer 20 includes first and second barrier layers 22 and 24. In addition, the first and second barrier layers 22 and 24 may directly make contact with each other.

In detail, the barrier layer 20 includes the first barrier layer 22 on the support substrate and the second barrier layer 24 on the first barrier layer 22. In other words, the first barrier layer 22 is adjacent to the support substrate 22, and the second barrier layer 24 is adjacent to the photo-electro conversion layer 30.

The first and second barrier layers 22 and 24 have porosities different from each other. In more detail, the first barrier layer 22 adjacent to the support substrate 10 has smaller porosity, so that the first barrier layer 22 may be densely formed. In addition, the second barrier layer 24 adjacent to the photo-electro conversion part 30 may have the porous structure representing greater porosity.

As described above, the first barrier layer 22 may have a dense structure, thereby effectively preventing the material of the support substrate 10 from diffusing to the photo-electro conversion part 30. For example, the first barrier layer 22 can prevent the material of the support substrate 10 and the impurities on the support substrate 10 from diffusing to the photo-electro conversion part 30 in a high-temperature heat treatment process to form the photo-electro conversion part 30.

The porosity of the first barrier layer 22 can represent about 10% or less, but the embodiment is not limited thereto. In detail, the porosity of the first barrier layer 22 may be about 5%, or about 1% or less of porosity, but the embodiment is not limited thereto.

As described above, the second barrier layer 24 may have a porous structure representing greater porosity. Accordingly, the contact area between the second barrier layer 24 and the photo-electro conversion part 30 may be increased. In addition, the delamination between the second barrier layer 24 and the photo-electro conversion part 30 can be effectively prevented, and the surface area of the photo-electro conversion part 30 is increased, so that the photo-electro conversion efficiency can be improved.

The porosity of the second barrier layer 24 may be in the range of about 20% to about 40%, but the embodiment is not limited thereto. In detail, the porosity of the second barrier layer 24 may be in the range of about 30% to about 40%, but the embodiment is not limited thereto.

Meanwhile, although accompanying drawings and the detailed description disclose that the first and second barrier layers 22 and 24 constituting the barrier layer 20 are separately formed from each other, but the embodiment is not limited thereto. In other words, the scope of the present embodiment reaches the case in which the porosity of a portion of the barrier layer 20 adjacent to the support substrate 10 is different from the porosity of a portion of the barrier layer 20 adjacent to the photo-electro conversion part 30 in the barrier layer 20 even if the boundary between the first barrier layer 22 and the second barrier layer 24 is unclear.

In other words, the solar cell according to the embodiment includes the first barrier layer 22, which has the dense structure and is adjacent to the support substrate 10, and the second barrier layer 24 which has the porous structure and is adjacent to the photo-electro conversion part 30. Accordingly, the barrier layer 20 not only can prevent impurity diffusion and the delamination phenomenon, but also can improve the photo-electro conversion efficiency.

The first and second barrier layers 22 and 24 may include oxide. In detail, the first and second barrier layers 22 and 24 may include metallic oxide. For example, each of the first and second barrier layers 22 and 24 may include material selected from the group consisting of aluminum oxide, titanium oxide, magnesium oxide, tungsten oxide, and the combination thereof.

In addition, the first barrier layer 22 may include only metal, or may include both of the metal and the oxide of the metal. For example, the first barrier layer 22 may include any material selected from the group consisting of aluminum (Al), titanium (Ti), magnesium (Mg), tungsten (W), the oxide thereof, and the combination thereof.

The barrier layer 20 including the first and second barrier layers 22 an 24 has a thickness of about 5 µm or less, but the embodiment is not limited thereto. As described above, the barrier layer 20 may include oxide. If the oxide barrier layer 20 having a thickness exceeding about 5 µm is bent, the oxide barrier layer 20 may be cracked. Accordingly, the oxide barrier layer 20 having the thickness exceeding about 5 µm may not be applied to the flexible solar cell 100.

The first and second barrier layers 22 and 24 may include the same material. In this case, the first and second barrier layers 22 and 24 may be formed through a scheme of simply changing only the process conditions using the same material. Therefore, the manufacturing cost of the solar cell according to the embodiment can be reduced. Hereinafter, the method for manufacturing the solar cell will be described in more detail.

The ratio of the thickness of the second barrier layer 24 to the thickness of the first barrier layer 22 may be in the range of about 0.1 to about 0.3. If the ratio is 0.3, the second barrier layer 24 having the porous structure has a thick thickness, and the first barrier layer 22 has a thin thickness. Therefore, the first barrier layer 22 may not effectively prevent the diffusion of impurities. In addition, if the ratio is less than 0.1, the second barrier layer 24 has a thin thickness, so that the contact area may not be sufficiently ensured.

Referring to FIG. 2, according to the solar cell of the embodiment, the metallic layer 40 may be additionally provided on the substrate 10. The metallic layer 40 may include metal. For example, the metallic layer 40 may include material selected from the group consisting of Al, Ti, Mg, W, and the combination thereof.

The metallic layer 40 may be provided to form the barrier layer 20. For example, the barrier layer 20 may be formed by oxidizing the metallic layer 40. In this case, as shown in FIG. 1, the metallic layer 40 may be changed into the barrier layer 20 by oxidizing the entire portion of the metallic layer 40. However, as shown in FIG. 2, only a portion of the metallic layer 40 is changed into the barrier layer 20, and a portion of the metallic layer 40, which is not changed into the barrier layer 20, may remain on the support substrate 10.

The metallic layer 40 has a very dense structure like the first barrier layer 22. Therefore, together with the first barrier layer 22, the metallic layer 40 can effectively prevent the material of the support substrate 10 from diffusing to the photo-electro conversion part 30.

The photo-electro conversion part 30 is provided on the barrier layer 20. In detail, the photo-electro conversion part 30 is provided on the second barrier layer 24. The photo-electro conversion part 20 converts the solar energy into electrical energy.

The photo-electro conversion part 30 includes a first electrode layer 31, a light absorbing layer 33, and a second electrode layer 39. The photo-electro conversion part 30 may further include a buffer layer 35 and a high-resistance buffer layer 37 interposed between the light absorbing layer 33 and the second electrode layer 39, but the embodiment is not limited thereto.

The first electrode layer 31 may include material representing superior electrical characteristics. For example, the first electrode layer 31 may include molybdenum (Mo), copper (Cu), nickel (Ni), aluminum (Al), and the alloy thereof.

The light absorbing layer 33 is provided on the first electrode layer 31.

The light absorbing layer 33 may include a non-silicon-based material. In other words, the light absorbing layer 33 may include a group I-III-IV compound. For example, the light absorbing layer 33 may include a Cu—In—Ga—Se-based compound (Cu(In,Ga)Se$_2$, CIGS), a Cu—In—Se (CIS) compound, or a Cu—Ga—Se (CGS) compound.

The light absorbing layer 33 may include a group II-IV compound or a group III-IV compound. For example, the light absorbing layer 33 may include a Cd—Te compound or a Ga—As compound.

The buffer layer 35 on the light absorbing layer 33 can reduce the lattice constant difference and the energy band difference from the second electrode layer 29. For example, the light absorbing layer 33 may include cadmium sulfide (CdS).

The high-resistance buffer layer 37 on the buffer layer 35 can prevent the buffer layer 35 from being damaged when the second electrode layer 39 is formed. For example, the buffer layer 35 may include zinc oxide (ZnO).

The second electrode layer 39 may include a transparent conductive material. In addition, the second electrode layer 39 may have the characteristic of an N type semiconductor. In this case, the second electrode layer 39 constitutes an N type semiconductor layer together with the buffer layer 35 to form PN junction with the light absorbing layer 33 which serves as a P type semiconductor layer. For example, the second electrode layer 39 may include Al doped zinc oxide (AZO).

As described above, the solar cell according to the embodiment may include the light absorbing layer 33 including a CIGS-based compound, a CIS-based compound, a CGS-based compound, a Cd—Te compound or a Ga—As compound. Accordingly, the superior photo-electro conversion efficiency can be represented. Therefore, the solar cell 100 can have a thin thickness, can reduce the loss of the material, and can be utilized in various industrial fields.

Meanwhile, the present embodiment is not limited thereto. Therefore, the photo-electro conversion part 30 may include a photo-electro conversion part constituting a dye-sensitized solar cell, an organic solar cell, or a silicon solar cell.

Hereinafter, the method for manufacturing the solar cell according to the embodiment will be described with reference to FIGS. 3 to 6. The method for manufacturing the solar cell according to the preset embodiment will be described by making reference to the above description of the solar cell. The above description of the solar cell will be incorporated in the description of the method for manufacturing the solar cell according to the present embodiment.

FIGS. 3a to 3d are sectional views schematically showing the process steps in the method for manufacturing the solar cell according to the first embodiment.

Figure 3A:
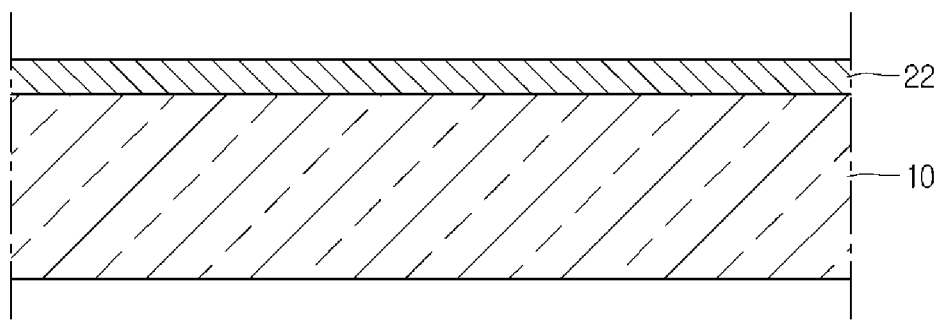
FIGS. 3a to 3c are sectional views showing the process steps in a method for manufacturing a solar cell according to a first embodiment.

As shown in FIG. 3a, the first barrier layer 22 is formed on the support substrate 10. The first barrier layer 22 may include oxide such as Al oxide, Ti oxide, Mg oxide, or W oxide, and may be formed through various schemes. For example, the first barrier layer 22 may be formed through a process selected from the group consisting of a sputtering process, an electroplating process, a micro-arc oxidation process, an anodizing process, and the combination thereof.

Figure 3B:
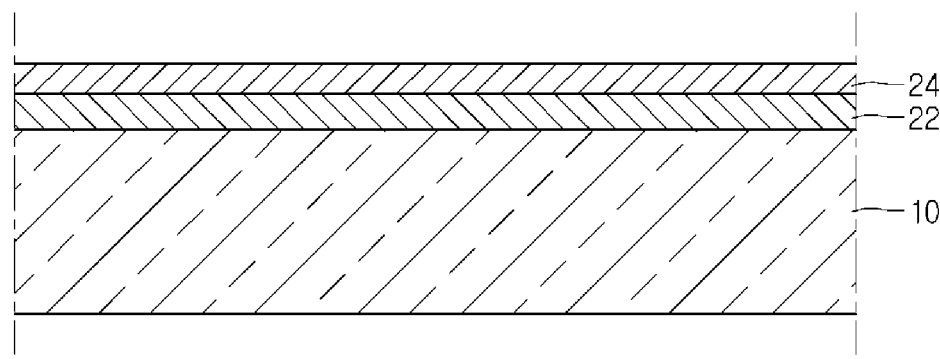

Thereafter, as shown in FIG. 3b, the second barrier layer 24 is formed on the first barrier layer 22 with the porosity higher than that of the first barrier layer 22.

The second barrier layer 24 may include oxide such as Al oxide, Ti oxide, Mg oxide, and W oxide, and may be formed through various schemes. For example, the second barrier layer 24 may be formed through a process selected from the group consisting of a sputtering process, an electroplating process, a micro-arc oxidation process, an anodizing process, and the combination thereof.

The first and second barrier layers 22 and 24 may include the same material. In this case, the first and second barrier layers 22 and 24 may be formed through a scheme of simply changing only the process conditions under the same process. For example, after the first barrier layer 22 has been formed through an electroplating process, the second barrier layer 24 may be formed in a porous structure through a micro-arc oxidation process in which a high-voltage is alternately applied to an anode electrode and a cathode electrode in the same plating bath.

As described above, in the method for manufacturing the solar cell according to the present embodiment, the barrier layer 20 including layers, which are adjacent to the support substrate 10 and the photo-electro conversion part 30, respectively and have porosities different from each other, can be formed through a simple process.

In order to reduce the roughness of the barrier layer 20, a process of polishing the barrier layer 20 may be further performed. The polishing process may be performed before the photo-conversion part 30 is formed on the barrier layer 20 after the barrier layer 20 has been formed. In addition, the polishing process includes both of a mechanical polishing process and/or a chemical polishing process.

Figure 3C:
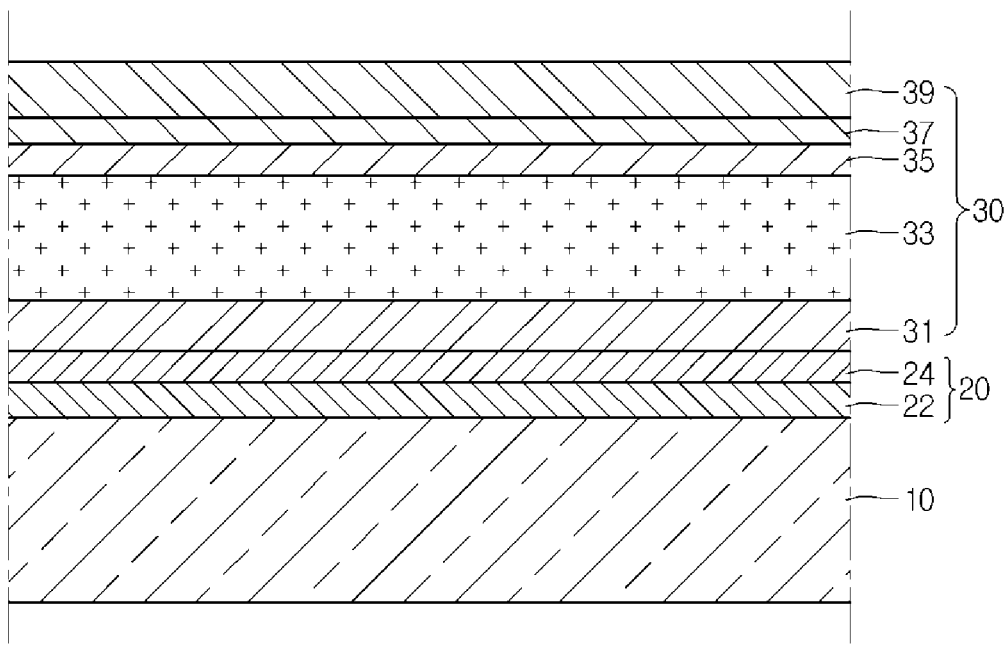

Thereafter, as shown in FIG. 3c, the photo-electro conversion part 30 is formed on the barrier layer 20 to manufacture the solar cell 100. Hereinafter, the detail thereof will be described.

First, the first electrode layer 31 is formed on the barrier layer 20. For example, the first electrode layer 31 may be formed by depositing Mo through a sputtering process. In addition, the first electrode layer 31 may include at least two layers. The layers may include the same metal, or may include different metals. The first electrode layer 31 including the at least two layers may be formed through two processes having process conditions different from each other.

Next, the light absorbing layer 33 is formed on the first electrode layer 31. The light absorbing layer 33 may be formed through various schemes. For example, the light absorbing layer 33 may be formed through an evaporation scheme or a sputtering process.

According to the evaporation scheme, the CIGS-based light absorbing layer 33 may be formed by simultaneously or separately evaporating Cu, In, Ga, and Se.

According to the sputtering process, after a metallic precursor layer has been formed through the sputtering process, the CIGS-based light absorbing layer 33 may be formed through the selenization process. In other words, after the metallic precursor layer including Cu, In, and Ga has been formed through the sputtering process using a Cu target, an In target, and a Ga target, the CIGS-based light absorbing layer 33 may be formed through the selenization process. In addition, the CIGS-based light absorbing layer 33 may be formed by simultaneously performing the sputtering process and the selenization process.

Although the above method discloses the forming of the CIGS-based light absorbing layer 33, a target an evaporation material vary depending on a desired material to form various light absorbing layers.

Thereafter, the buffer layer 35 may be formed on the light absorbing layer 33. The buffer layer 35 may be formed through a chemical bath deposition (CBD) scheme, a sputtering scheme, an evaporation scheme, or a chemical vapor deposition (CVD) scheme.

The high-resistance buffer layer 37 is formed on the buffer layer 35. For example, the high-resistance buffer layer 37 may be formed by depositing ZnO. However, the embodiment is not limited thereto, and the high-resistance buffer layer 37 may be made of various materials through various schemes.

Thereafter, the second electrode layer 39 is formed on the high-resistance buffer layer 37.

Figure 4A:
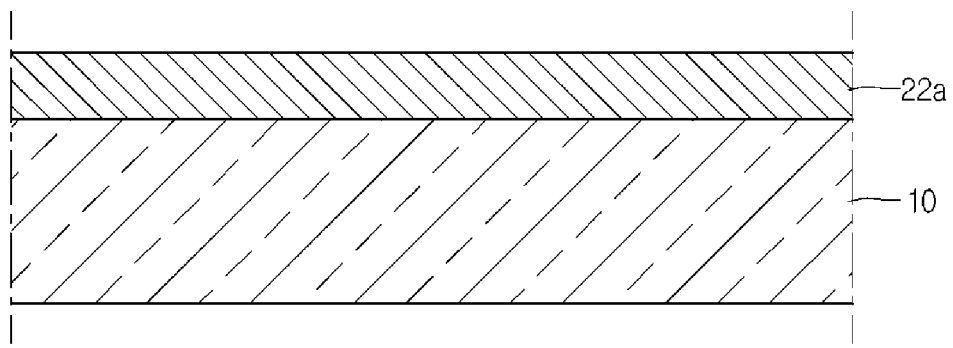
FIGS. 4a to 4c are sectional views showing the process steps in a method for manufacturing a solar cell according to a second embodiment.
Figure 4B:
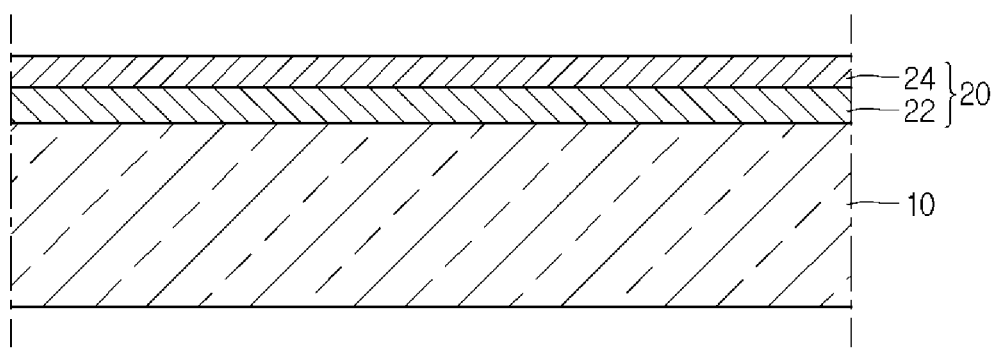
Figure 4C:
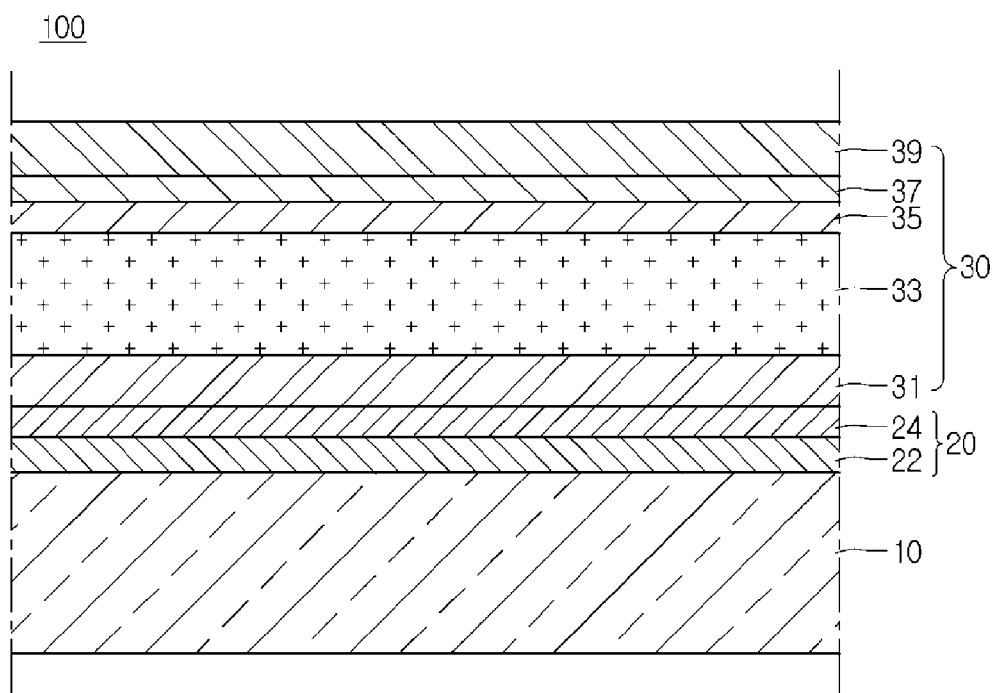

FIGS. 4a to 4c are sectional views showing the process steps in a method for manufacturing a solar cell according to a second embodiment.

In the method for manufacturing the solar cell according to the second embodiment, the second barrier layer 24 having higher porosity may be formed by etching the upper portion of a first barrier layer 22a. For example, the upper portion of the first barrier layer 22a may be etched by using a fluoride etchant to form the second barrier layer 24. A portion of the first barrier layer 22a, which is not etched, remains as the first barrier layer 22. Thereafter, as shown in FIG. 5c, the photo-electro conversion part 30 is formed on the barrier layer 20 to manufacture the solar cell 100.

As described above, according to the second embodiment, the barrier layer 20 including the first and second barrier layers 22 and 24 may be manufactured through the simple process of etching the first barrier layer. Therefore, the barrier layer 20, in which the porosity of a portion adjacent to the support substrate 10 is different from the porosity of a portion adjacent to the photo-electro conversion part 30, can be formed through a simple process.

Figure 5:
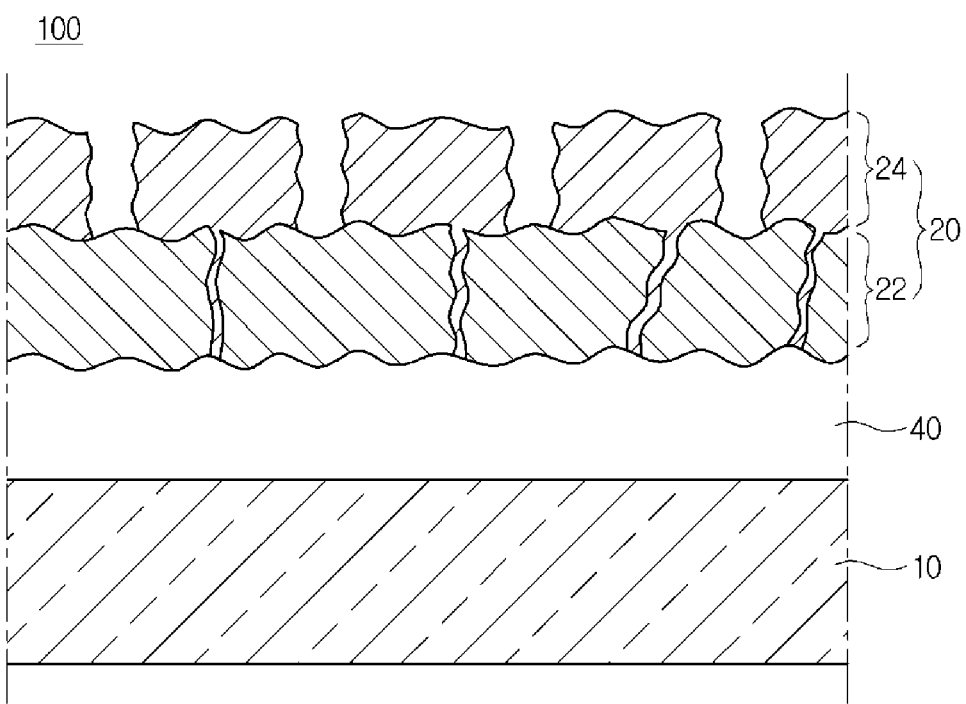
FIGS. 5 and 6 are sectional views showing a metallic layer and a barrier layer of the solar cell according to the embodiment.
Figure 6:
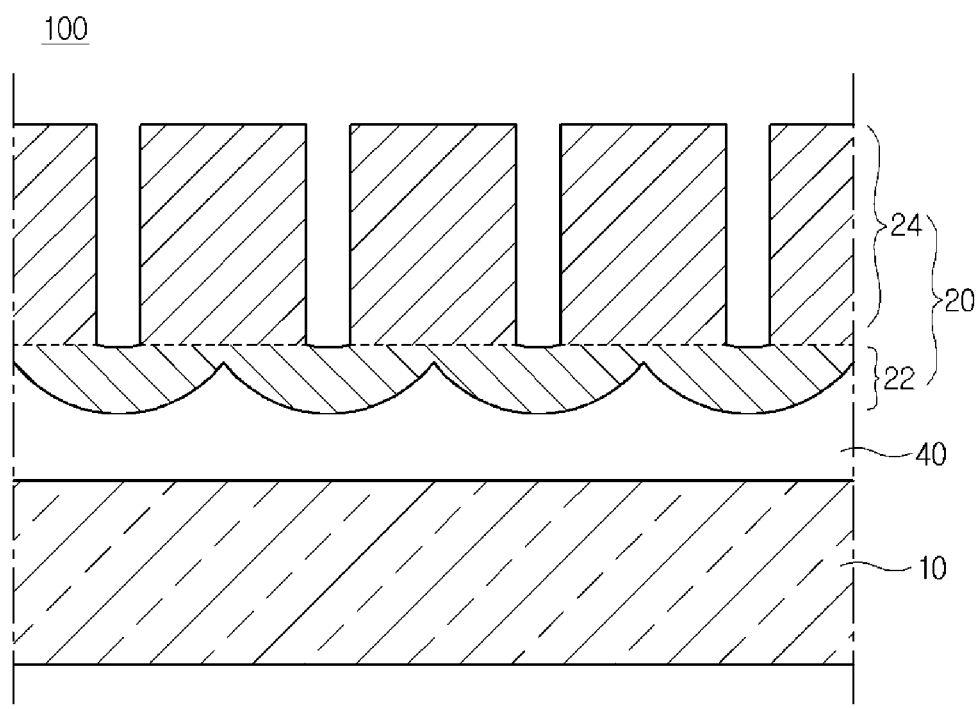

FIGS. 5 and 6 are sectional views showing solar cells manufactured according to third and fourth embodiments.

According to the third and fourth embodiments, the barrier layer 20 may be formed by oxidizing the metallic layer 40 after the metallic layer 40 has been formed on the support substrate 10.

The metallic layer 40 may be formed on the support substrate 10 through various processes such as a sputtering process and an electroplating process. Next, the metallic layer 40 is oxidized. In this case, depending on the oxidized degree of the metallic layer 40, the metallic layer 40 remains on the support substrate 10 as shown in FIG. 2, or the entire portion of the metallic layer 40 may be changed into two barrier layers as shown in FIG. 1.

Referring to FIG. 5, the Al metallic layer 40 is formed on the support substrate 10 through an electroplating process. The upper portion of the Al metallic layer 40 is oxidized through the micro-arc oxidation process so that the upper portion of the Al metallic layer 40 can be changed into the barrier layer 20. In this case, a portion of the Al metallic layer 40 may remain on the support substrate 10 without being oxidized.

FIG. 6 is a sectional view showing the metallic layer 40 and the barrier layer 20 according to the fourth embodiment. Referring to FIG. 6, the barrier layer 20 may be formed by anodizing the metallic layer 40. In the anodizing process for the metallic layer 40, the first and second barrier layers 22 and 24 may be simultaneously formed. In detail, the barrier layer 20 may include the first barrier layer 22 having a dense structure in adjacent to the support substrate 10 and the second barrier layer 24 having a porous structure in adjacent to the photo-electro conversion part 30.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a support substrate;
a barrier layer on the support substrate; and
a photo-electro conversion part on the barrier layer,
wherein the barrier layer comprises first and second barrier layers having porosities different from each other;
wherein the support substrate includes a flexible metallic substrate;
wherein the photo-electro conversion part includes a first electrode layer, a light absorbing layer, and a second electrode layer;
wherein the first and second barrier layers are in direct physical contact with each other;
wherein the second barrier layer is in direct physical contact with the first electrode layer;
wherein the first electrode layer includes at least one of molybdenum (Mo), copper (Cu), nickel (Ni), aluminum, and an alloy thereof;
wherein the porosity of the second barrier layer is higher than the porosity of the first barrier layer; and
wherein the porosity of the second barrier layer is in a range of 20% to 40%.

2. The solar cell of claim 1, further comprising a metallic layer on the support substrate.

3. The solar cell of claim 1, wherein the first barrier layer is provided on the support substrate, and
the second barrier layer is provided on the first barrier layer.

4. The solar cell of claim 1, wherein the porosity of the first barrier layer is 10%.

5. The solar cell of claim 1, wherein the first and second barrier layers include a same material.

6. The solar cell of claim 1, wherein a ratio of a thickness of the second barrier layer to a thickness of the first barrier layer is in a range of 0.1 to 0.3.

7. The solar cell of claim 1, wherein the barrier layer has a thickness of 5 µm or less.

8. The solar cell of claim 1, wherein the barrier layer includes oxide.

9. The solar cell of claim 8, wherein the barrier layer includes at least one selected from the group consisting of aluminum oxide, titanium oxide, magnesium oxide, tungsten oxide, and a combination thereof.

10. The solar cell of claim 1,
   wherein the first electrode layer is on the barrier layer,
   wherein the light absorbing layer is on the first electrode layer,
   wherein the second electrode layer is on the light absorbing layer, and
   wherein the second electrode layer includes a transparent conductive material.

* * * * *